(12) United States Patent
Sickels (10) Patent No.: US 7,230,833 B1
(45) Date of Patent: Jun. 12, 2007

(54) ELECTRONICS MODULE RETENTION SYSTEM

(75) Inventor: Dennis Gene Sickels, Marshalltown, IA (US)

(73) Assignee: Daniel Industries, Inc., Houston, TX (US)

( * ) Notice: Subject to any disclaimer, the term of this patent is extended or adjusted under 35 U.S.C. 154(b) by 39 days.

(21) Appl. No.: 11/278,567

(22) Filed: Apr. 4, 2006

(51) Int. Cl.
  *H05K 7/10* (2006.01)
  *H05K 7/12* (2006.01)
(52) U.S. Cl. ............ 361/747; 361/740; 361/759; 361/802; 361/788; 361/796; 439/76.1
(58) Field of Classification Search ............ 361/740, 361/741, 752, 759, 756, 796, 788, 802, 747, 361/728, 730; 439/76.1, 76.2, 65, 64, 66
See application file for complete search history.

(56) References Cited

U.S. PATENT DOCUMENTS

| 5,428,535 | A | * | 6/1995 | Katsumata et al. ......... 701/36 |
| 5,793,615 | A | * | 8/1998 | Bach et al. ............... 361/752 |
| 5,896,473 | A | * | 4/1999 | Kaspari .................. 385/24 |
| 6,241,530 | B1 | * | 6/2001 | Eddy et al. .............. 439/61 |
| 6,456,495 | B1 | * | 9/2002 | Wieloch et al. .......... 361/729 |
| 6,643,141 | B2 | * | 11/2003 | Kaetsu et al. ............ 361/797 |
| 6,654,253 | B1 | * | 11/2003 | DiMarco ................ 361/730 |
| 6,661,671 | B1 | * | 12/2003 | Franke et al. ............ 361/752 |
| 7,042,737 | B1 | * | 5/2006 | Woolsey et al. .......... 361/799 |
| 2006/0286824 | A1 | * | 12/2006 | Busse et al. ............. 439/65 |

* cited by examiner

*Primary Examiner*—Dean A. Reichard
*Assistant Examiner*—Dameon E. Levi
(74) *Attorney, Agent, or Firm*—Conley Rose, P. C.

(57) ABSTRACT

An electronics module comprises an electronics assembly having a first connector and a second connector. The first and second connectors are disposed on opposite ends of the electronics assembly. A case encloses the electronics assembly. The first connector is accessible through a first side of the case and the second connector is accessible through a second side of the case. A locking tab is disposed on the case and is biased to an extended position. A sliding member is slidably coupled to the case and is operable to move the locking tab to a retracted position.

20 Claims, 8 Drawing Sheets

ELECTRONICS MODULE RETENTION SYSTEM

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The invention relates to methods and apparatus for retaining sub-components within an assembly. More specifically, embodiments of the invention are related to systems and apparatus for simplifying the installation and removal of an electronics assembly into a housing.

In oil and gas applications, flow computers are used for high-performance measurement and control functions, such as fiscal metering, custody transfer, batch loading, meter proving, multi-stream measurement, station monitoring/control and other applications. In order to provide flexible configurations and simplify maintenance, many of these flow computers utilize separate electronics modules to perform individual functions. Because a particular flow computer may only perform a limited number of functions, only those modules required to perform the needed functions are installed in the flow computer at a given time.

In order to provide a high level of configurability and customization, many flow computers are constructed so that the electronics modules can be easily changed or replaced. The electronics modules are often coupled to the flow computer by a retention system that supports field removal and replacement of electronics modules. Many of these retention systems utilize mechanical coupling mechanisms that require the use of a screwdriver, or other tool, to actuate. Many mechanical retention systems also take up valuable space within the flow computer housing, both for the retention system and for the space needed to provide tool access. In some instances the space needed for the retention system requires larger enclosures and system footprints.

Thus, the embodiments of the present invention are directed to methods and apparatus for retaining an electronics module that seek to overcome these and other limitations of the prior art.

SUMMARY OF THE PREFERRED EMBODIMENTS

Embodiments of the present invention include an electronics module comprising an electronics assembly comprising a first connector and a second connector. The first and second connectors are disposed on opposite ends of the electronics assembly. A case encloses the electronics assembly. The first connector is accessible through a first side of the case and the second connector is accessible through a second side of the case. A locking tab is disposed on the case and is biased to an extended position. A sliding member is slidably coupled to the case and operable to move the locking tab to a retracted position.

Other embodiments comprise an electronics block assembly comprising a backplane disposed within a housing. A sleeve is disposed within a receptacle in the housing. An electronics module is enclosed within a case that is insertable into the sleeve. A locking tab is disposed on the case and is biased to an extended position where the locking tab is engaged with the sleeves. A sliding member is slidably coupled to the case and operable to move the locking tab to a retracted position wherein the locking tab is not engaged with the sleeve.

Other embodiments include a method comprising disposing an electronics assembly within a case to form an electronics module. The case comprises a locking tab disposed on the case and biased to an extended position. A sliding member slidably coupled to the case and operable to move the locking tab to a retracted position. The method further comprises installing the electronics module into a sleeve disposed within housing, wherein the locking tab engages the sleeve when the locking tab is in the extended position.

Thus, the embodiments of the present invention comprise a combination of features and advantages that enable substantial enhancement of the installation and retention of electronics modules. These and various other characteristics and advantages of the present invention will be readily apparent to those skilled in the art upon reading the following detailed description of the preferred embodiments of the invention and by referring to the accompanying drawings.

BRIEF DESCRIPTION OF THE DRAWINGS

For a more detailed description of the present invention, reference is made to the accompanying Figures, wherein.

DETAILED DESCRIPTION OF THE PREFERRED EMBODIMENTS

In the description that follows, like parts are marked throughout the specification and drawings with the same reference numerals, respectively. The drawing figures are not necessarily to scale. Certain features of the invention may be shown exaggerated in scale or in somewhat schematic form and some details of conventional elements may not be shown in the interest of clarity and conciseness.

Figure 1:
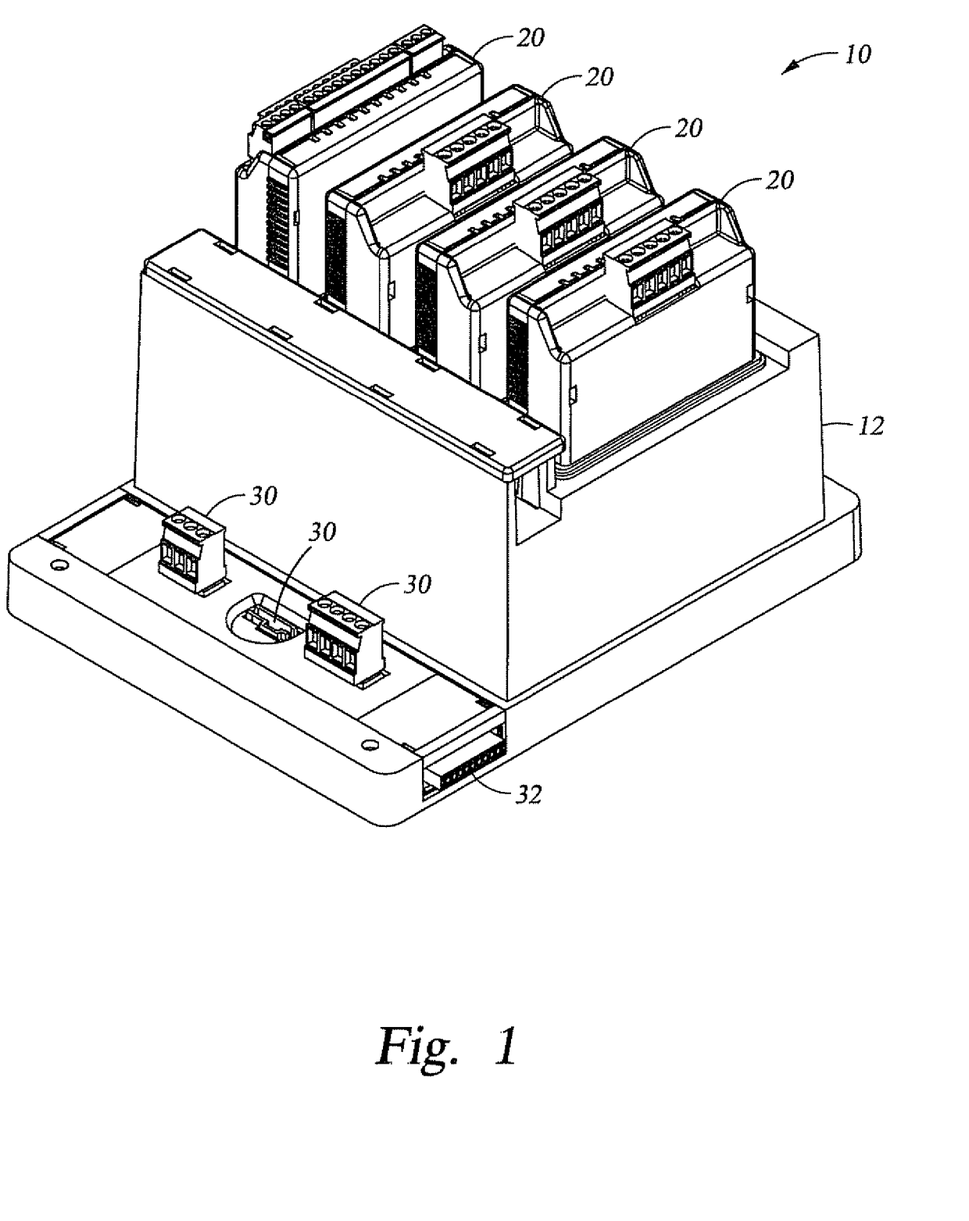
FIG. 1 is an isometric view of one embodiment of an electronics assembly constructed in accordance with embodiments of the invention.
Figure 2:
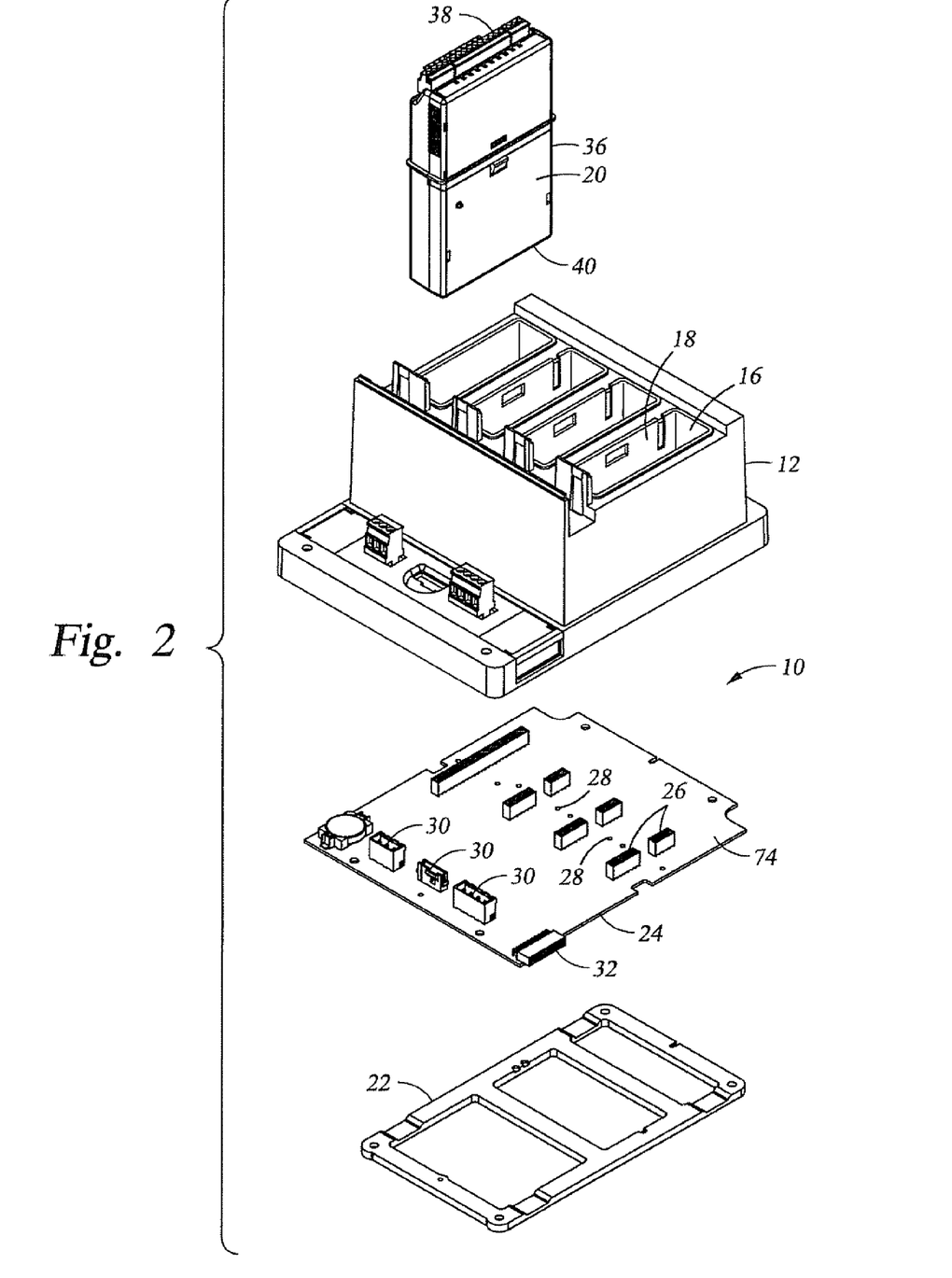
FIG. 2 is a partial exploded view of the electronics block assembly of FIG. 1.

FIGS. 1 and 2 illustrate one embodiment of an electronics block assembly 10 that is used in a flow computer. FIG. 2 shows a partially exploded view of block assembly 10. Electronics block assembly 10 comprises housing 12, backplane 14, receptacles 16, sleeves 18, and electronic modules 20. Support rack 22 couples backplane 14 to housing 12. Backplane 14 comprises printed circuit board 24 having module connectors 26, alignment holes 28, accessory connectors 30, and expansion connector 32. Sleeves 18 are disposed within receptacles 16 of housing 12 and receive electronics modules 20. Electronic modules 20 comprise an electronics assembly 34 disposed within case 36. Electronics assembly 34 comprises external connectors 38 and internal connectors 40, both of which are accessible through case 36.

In certain embodiments, electronics assemblies comprise circuitry that provides high-performance measurement and control functions. External connectors 38 on the external end of module 40 and provide connection points for electrical leads and other components. For example, external connectors 38 may be a termination block that provides connection points for various sensors, meters, and other instrumentation. In general, these sensors and other instrumentation provide raw data to electronics assembly 34 and allow control signals to return to the connected equipment. The circuitry within electronics assembly 34 manipulates the raw data and converts the data into useful information for functions such as fiscal metering, custody transfer, batch loading, meter proving, multi-stream measurement, station monitoring/control.

When electronics modules 20 are disposed within sleeves 18, internal connectors 40 are disposed within housing 12 and are engaged with module connectors 26 on backplane 14. Backplane 14 interconnects the plurality of electronics modules 20 so as to allow communication between electronics assemblies 34 as well as provide a single location through which the information can be transmitted or communicated.

Figure 3:
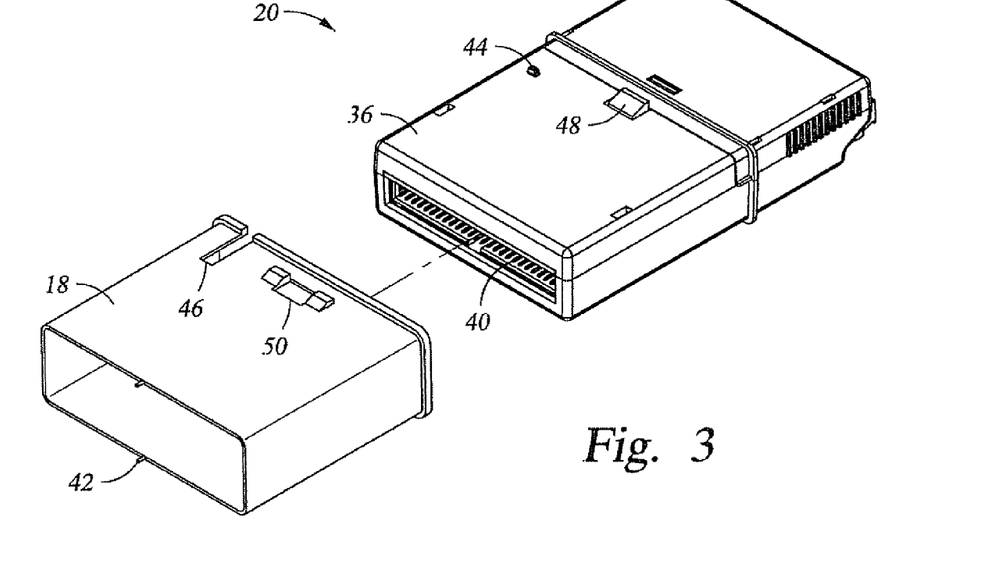
FIG. 3 is a partial exploded view of select components of the electronics block assembly of FIG. 1.

Housing 12 and electronics modules 20 are configured so as to simplify the connection of the electronics modules to backplane 14. Therefore, block assembly 10 may include one or more features that aid in the alignment and engagement of electronics modules 20 with backplane 14. In order to ensure that internal connectors 40 align with and engage module connectors 26, sleeves 18 and electronics modules 20 comprise one or more alignment features. Referring now to FIG. 3, sleeve 18 comprises alignment pins 42. When sleeve 18 is disposed within housing 12 (as shown in FIG. 1), alignment pins 42 engage alignment holes 28 (see FIG. 2) on backplane 14. The interface of alignment holes 28 and pins 42 fixes the position of sleeve 18 relative to module connectors 26 (see FIG. 2). Electronics module 20 further comprises key 44 that aligns with and engages slot 46 on sleeve 18. Key 44 and slot 46 prevent module 20 from being installed in sleeve 18 in an incorrect orientation.

Figure 4:
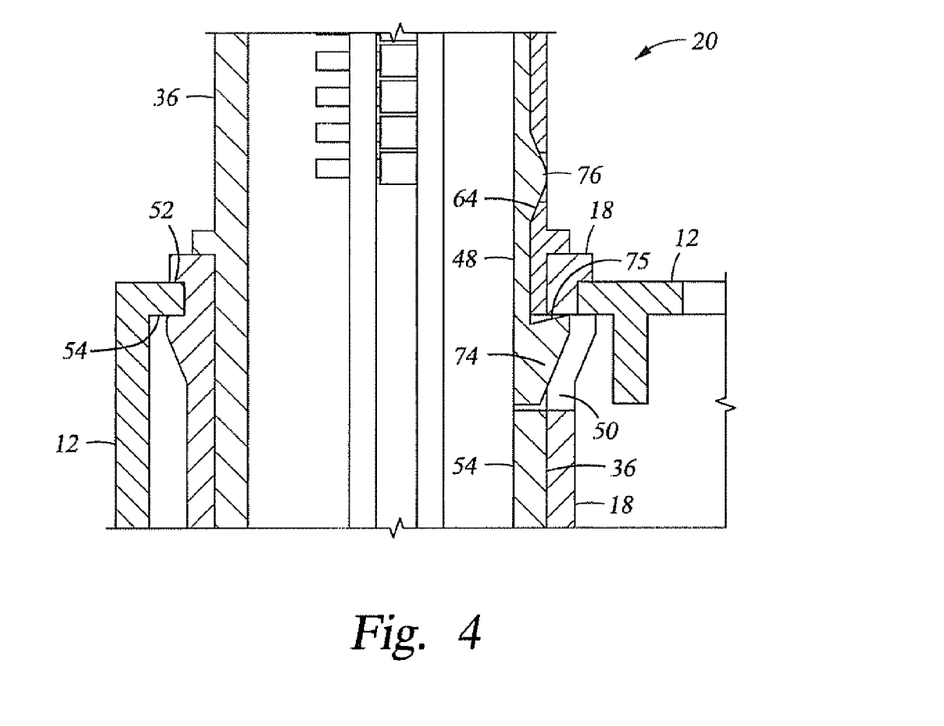
FIG. 4 is a partial sectional view of a portion of the electronics block assembly of FIG. 1.

Block assembly 10 may also include one or more retention mechanisms that secure electronics module 20 to housing 12. The retention system retains electronics module 20 within sleeve 18 of housing 12 but also allows for simple disengagement and removal of the module when desired. Components of the retention system can be seen in FIG. 3 where case 36 of electronics module 20 comprises locking tab 48 that engages aperture 50 on sleeve 18. The engagement of locking tab 48 and aperture 50 is shown in FIG. 4. FIG. 4 also shows groove 52 on sleeve 18 engaging flange 54 of housing 12 in order to couple the sleeve to the housing.

Figure 5:
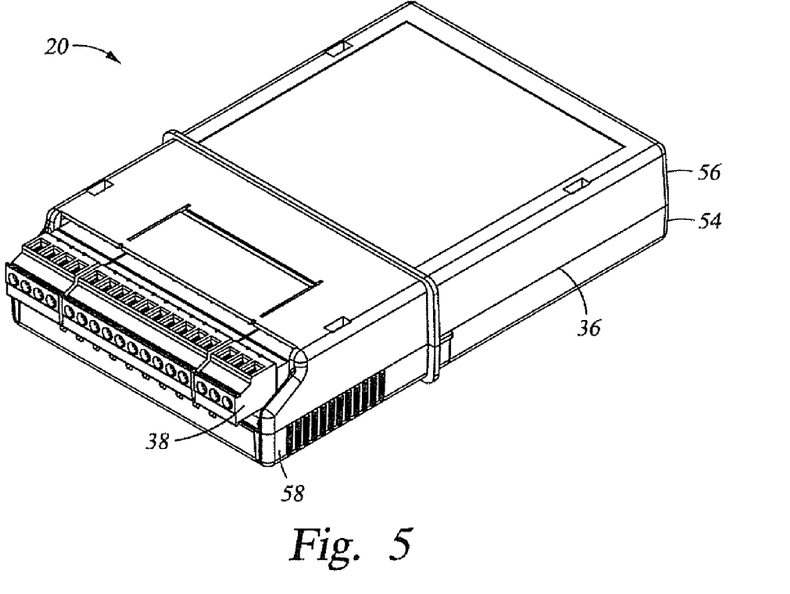
FIG. 5 is an isometric view of one embodiment an electronics module constructed in accordance with embodiments of the invention.
Figure 6:
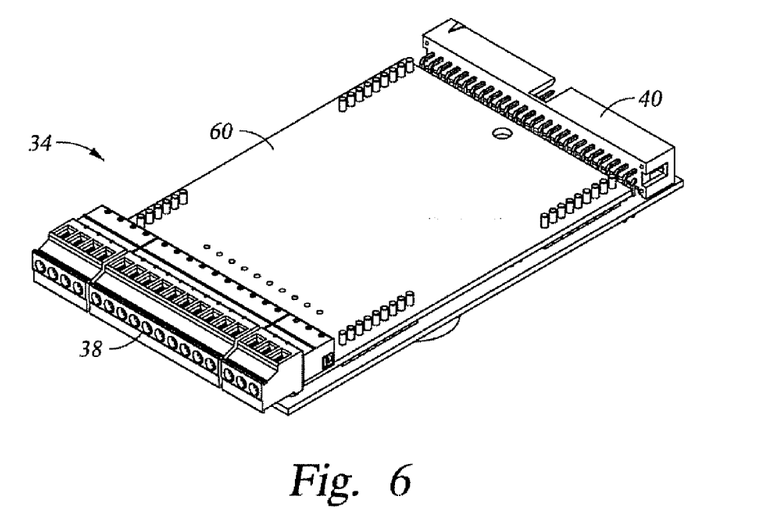
FIG. 6 is an isometric view of an electronics assembly constructed in accordance with embodiments of the invention.

Referring now to FIG. 5, electronics module 20 comprises electronics assembly 38 disposed within case 32. Case 32 comprises base 54, cover 56, and sliding member 58. One embodiment of electronics assembly 38 is shown in FIG. 6 and comprises circuit board 60, external connectors 38, and internal connectors 40. In certain embodiments, circuit board comprises processors and other electronic devices that process data that is transmitted through connectors 38 and 40.

Figure 7:
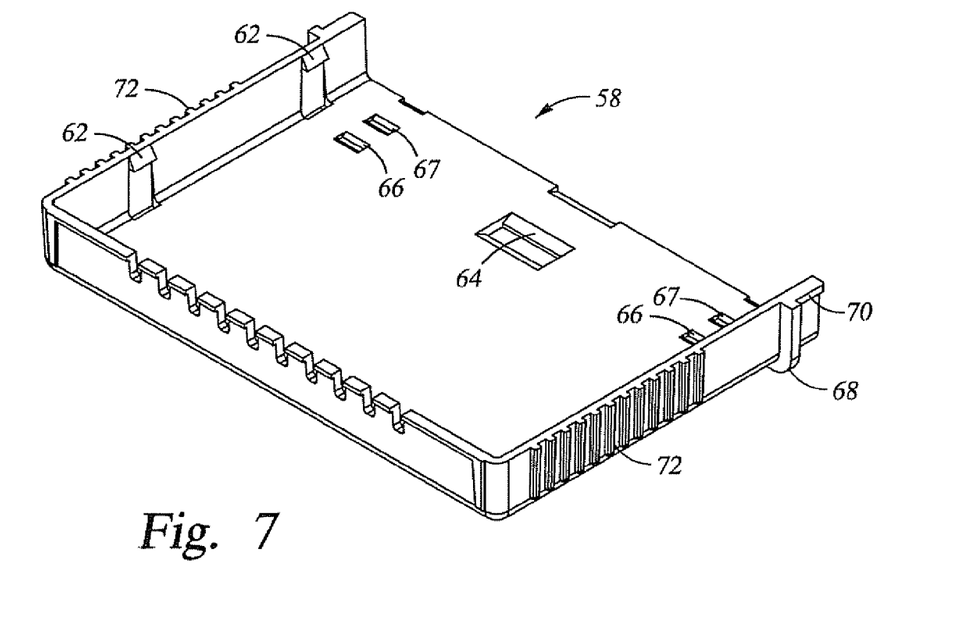
FIG. 7 is an isometric view of a sliding member used with the electronics module of FIG. 5.
Figure 8:
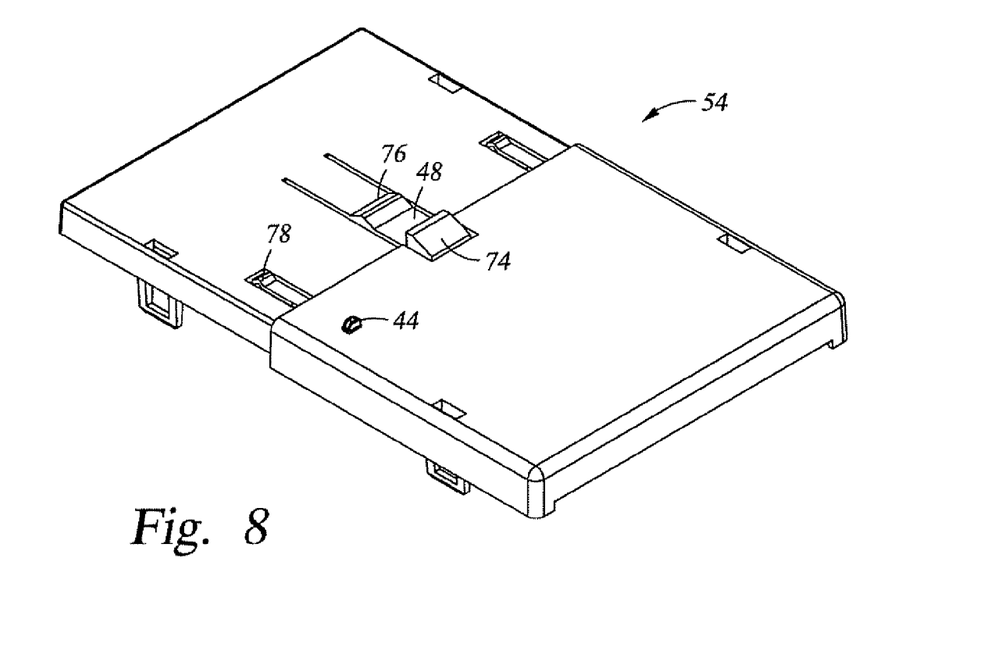
FIG. 8 is an isometric view of a base used with the electronics module of FIG. 5.
Figure 9:
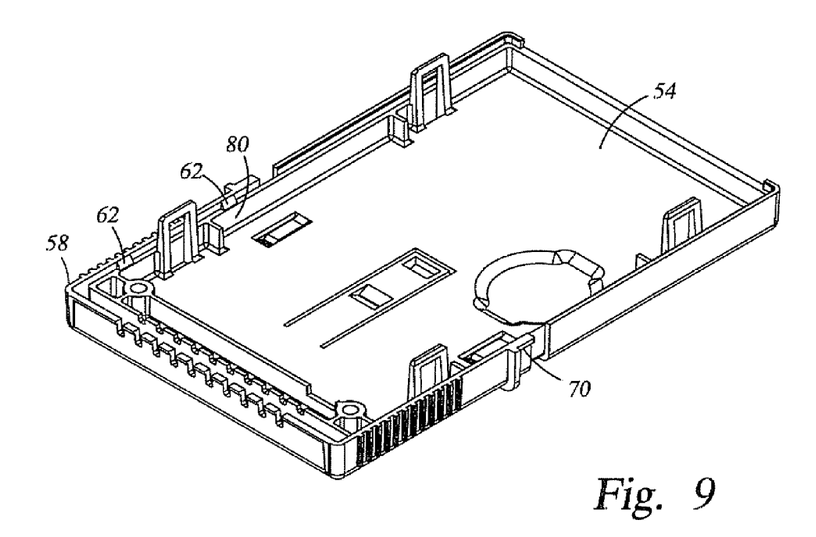
FIG. 9 is an isometric view of the sliding member of FIG. 7 installed on the base of FIG. 5.

Sliding member 58 is shown in FIG. 7 and comprises retention tabs 62, locking tab ramp 64, friction tab detents 66 and 67, flange 68, fill tabs 70, and gripping surface 72. Base 54 is shown in FIG. 8 and comprises locking tab 48, engagement member 74, actuation cam 76, friction tabs 78, and key 44. Sliding member 58 is assembled onto base 54 so that retention tabs 62 overlap and engage wall 80 on both sides of the base as shown in FIG. 9. Sliding member 58 can slide relative to base 54 from a first position to a second position. Retention tabs 62 fit within a slot located on cover 56 (not shown) when case 32 is assembled as shown in FIG. 5. The engagement of retention tabs 62 and the slot on cover 56 also limit the sliding movement of sliding member 58 as it moves from the first position to the second position.

Referring now to FIG. 4, sliding member 58 is shown in the first position where actuation cam 76 is disposed adjacent to ramp 64. In the first position, locking tab 48 is in a position substantially flush with base 54 and engagement member 74 is fully extended from base 54. With sliding member 58 in the first position, electronics module 20 can be inserted into sleeve 18. As the angled leading edge of engagement member 74 contacts sleeve 18, locking tab 48 will deflect inward. Once electronics module 20 is fully inserted into sleeve 18, engagement member 74 aligns with aperture 50 and the bias of locking tab 48 will return the engagement member to its extended, first position. Thus, in the first position, engagement member 74 of locking tab 48 engages aperture 50 on sleeve 18 and retains electronics module 20 within the sleeve. In certain embodiments, surface 75 of engagement member 74 is tapered such that as electronics module 20 moves upward the engagement of aperture 50 and the tapered surface prevents the engagement member from dislodging from the aperture.

Figure 10:
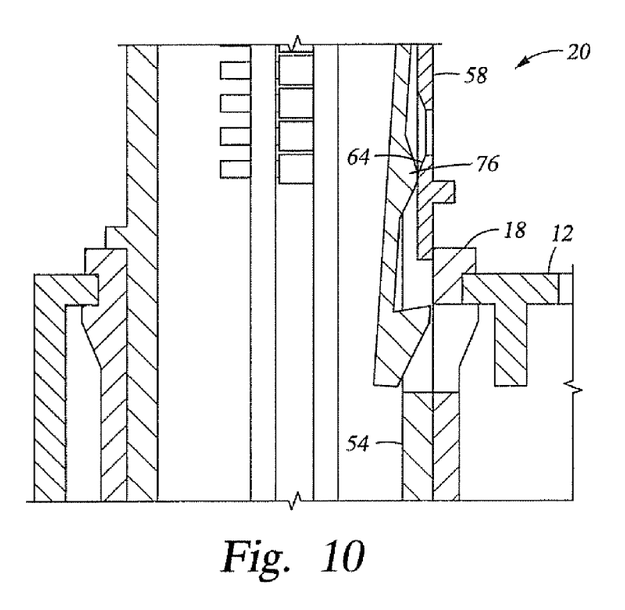
FIG. 10 is a partial sectional view of an electronics module disengaged from a sleeve.

Sliding member 58 is shown in the second position in both FIGS. 9 and 10. FIG. 9 shows the relationship between sliding member 58 and base 54. FIG. 10 is a partial sectional view illustrating the disengagement electronics module 20 from sleeve 18. Sliding member 58 is moved from the first position to the second position (as shown in FIG. 9) by sliding the sliding member relative to base 54. As the sliding member 58 slides relative to base 54, actuation cam 76 engages ramp 64. The movement of actuation cam 76 along ramp 64 urges locking tab 48 inward into the interior of base 54. This inward movement causes engagement member 74 to retract and disengage from sleeve 18 as is shown in FIG. 10. Once engagement member 74 is disengaged from sleeve 18, electronics module 20 can be removed from the sleeve. When in the second position, fill tabs 70 are removed from sleeve 18 so as to allow electronics module 20 to move slightly relative to the sleeve in order to make removal easier.

Figure 11:
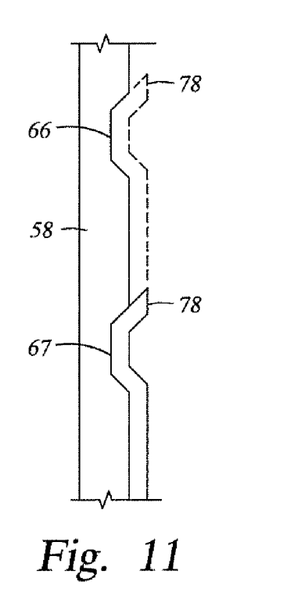
FIG. 11 is a partial sectional view showing the interaction of friction tabs and detents.

Referring now to FIG. 11, friction tabs 78 and detents 66 and 67 give sliding member 58 a taught feel and provide a snap-action as a position indicator at both the first and second positions. When sliding member 58 is in the first position, friction tab 78 is disposed within detent 66. As sliding member 58 is moved relative to base 54, friction tab 78 deflects inward so that the tab disengages detent 66. Once sliding member 58 reaches the second position, friction tabs 78 engages detent 67.

Figure 12:
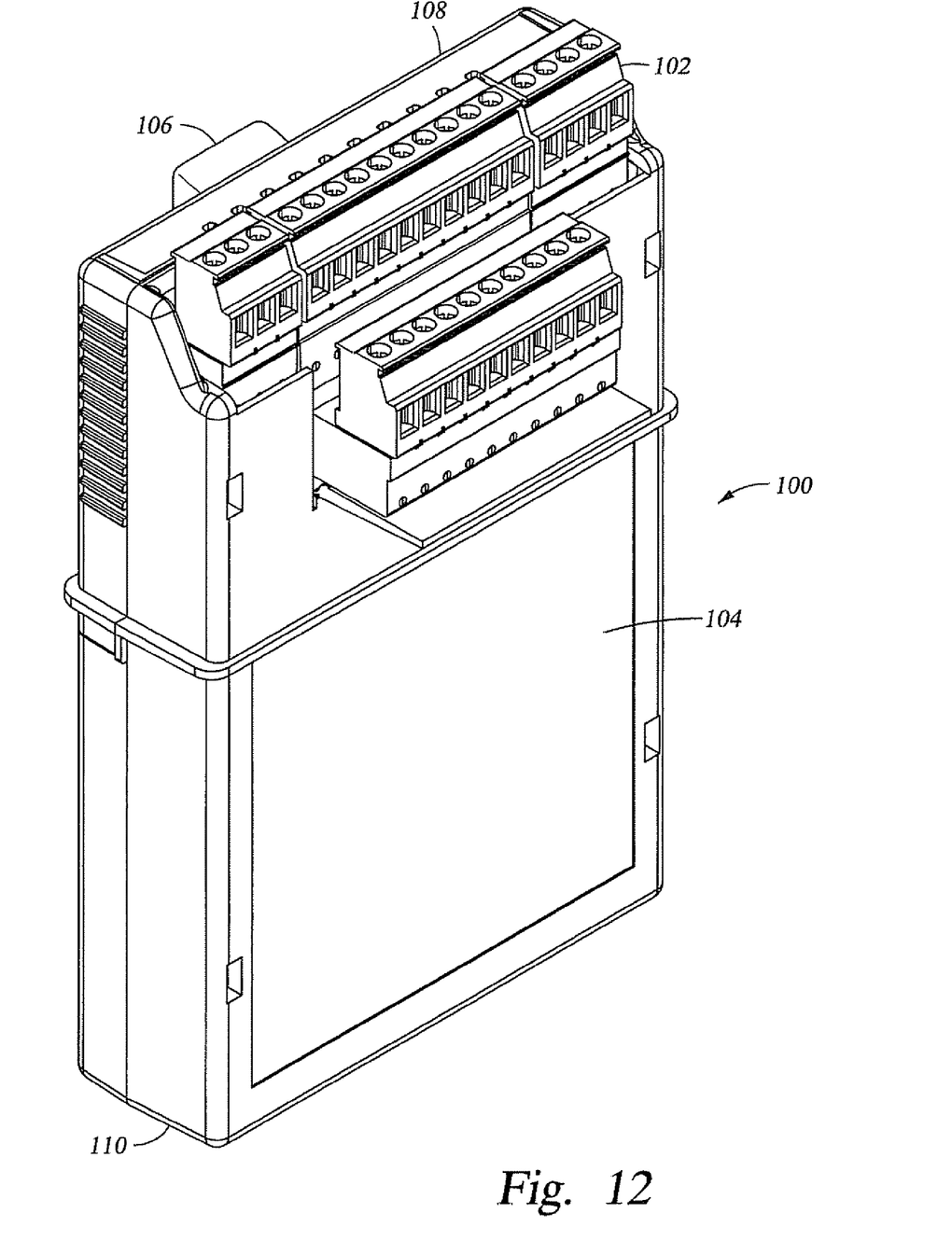
FIG. 12 is an isometric view of one embodiment of an electronics module constructed in accordance with embodiments of the invention.

Referring now to FIG. 12, electronics module 100 comprises electronics assembly 102, case 104, and sliding member 106. Electronics assembly 102 is disposed within case 104 and comprises external connectors 108 and internal connectors 110, both of which are accessible through case 104. Sliding member 106 is preferably positioned off of the centerline of case 104. The off-center positioning allows two adjacent electronics modules 100 to be placed in close proximity as their respective sliding members 106 would not interfere when the adjacent modules are positioned back-to-back.

Figure 13:
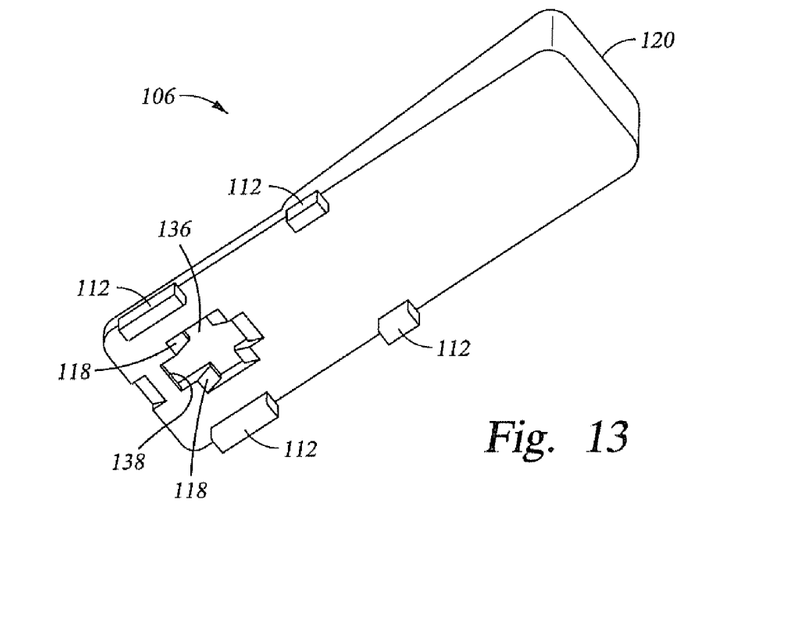
FIG. 13 is a partial isometric view of the case of the electronics module of FIG. 12.
Figure 14:
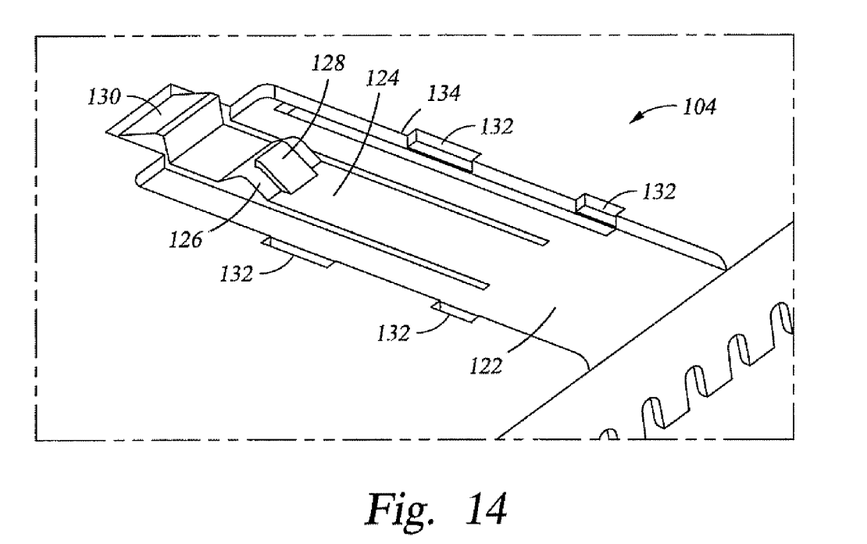
FIG. 14 is an isometric view of a sliding member used with the electronics module of FIG. 12.

Referring now to FIG. 13, sliding member 106 comprises slide tabs 112, ramp 118, and pull tab 120. As shown in FIG. 14, case 104 comprises recessed area 122. Locking tab 124 is disposed within recessed area 122 and comprises actuation cam 126, stop member 128, and engagement member 130. Slots 132 allow slide tabs 112 to pass therethrough so that slide tabs 112 are engaged in groove 134.

Sliding member 106 can slide relative to case 104 from a first position to a second position. In the first position, actuation cam 126 is disposed adjacent to ramp 118 in ramp aperture 136. In the first position, locking tab 124 is in a position substantially flush with recessed area 122 and engagement member 130 is fully extended. Sliding member 106 is moved from the first position to the second position by sliding the sliding member relative to case 104. As sliding member 106 slides relative to case 104, actuation cam 126 engages and slides along ramp 118 until stop member 128 contacts the edge 138 of ramp aperture 136. Stop member 128 and edge 138 act as a slide limiter to limit the movement of sliding member 106. The movement of actuation cam 126 along ramp 118 deflects locking tab 124 inward into the interior of case 104 and retracts engagement member 130 into case 104.

The preferred embodiments of the present invention relate to apparatus for connecting an electronic module to a block assembly. The present invention is susceptible to embodiments of different forms. There are shown in the drawings, and herein will be described in detail, specific embodiments of the present invention with the understanding that the present disclosure is to be considered an exemplification of the principles of the invention, and is not intended to limit the invention to that illustrated and described herein.

The embodiments set forth herein are merely illustrative and do not limit the scope of the invention or the details therein. It will be appreciated that many other modifications and improvements to the disclosure herein may be made without departing from the scope of the invention or the inventive concepts herein disclosed. Because many varying and different embodiments may be made within the scope of the inventive concept herein taught, including equivalent structures or materials hereafter thought of, and because many modifications may be made in the embodiments herein detailed in accordance with the descriptive requirements of the law, it is to be understood that the details herein are to be interpreted as illustrative and not in a limiting sense.

What is claimed is:

1. An electronics module comprising:
   an electronics assembly comprising a first connector and a second connector, wherein the first and second connectors are disposed on opposite ends of said electronics assembly, wherein at least one of the first and second connectors is operable to engage a backplane disposed within a housing;
   a case enclosing said electronics assembly, wherein the first connector is accessible through a first side of said case and the second connector is accessible through a second side of said case;
   a locking tab disposed on said case, wherein said locking tab is biased to an extended position wherein said locking tab is operable to engage a sleeve disposed within the housing; and
   a sliding member slidably coupled to said case and operable to move said locking tab to a retracted position.

2. The electronics module of claim 1 wherein said sliding member is slidably coupled to opposing sides of said case.

3. The electronics module of claim 1 wherein said sliding member is slidably coupled to a single side of said case.

4. The electronics module of claim 1 further comprising:
   a ramp disposed on said sliding member; and
   a cam disposed on said locking tab.

5. The electronics module of claim 1 further comprising a slide limiter that limits translation of said sliding member relative to said case.

6. The electronics module of claim 5 wherein said slide limiter is a stop member that engages said sliding member.

7. The electronics module of claim 1 further comprising a friction tab that engages a detent so as to indicate a position of said sliding member.

8. The electronics module of claim 1 further comprising a key mounted to said base.

9. An electronics block assembly comprising:
   a backplane disposed within a housing;
   a sleeve disposed within a receptacle in the housing;

an electronics module enclosed with a case that is insertable into said sleeve, wherein said electronics module comprises a first connector and a second connector that are accessible through opposite sides of the case;
a locking tab disposed on said case, wherein said locking tab is biased to an extended position wherein said locking tab is engaged with said sleeve; and
a sliding member slidably coupled to said case and operable to move said locking tab to a retracted position wherein said locking tab is not engaged with said sleeve.

10. The electronics block assembly of claim 9 wherein said sleeves are aligned with connectors disposed on said backplane.

11. The electronics block assembly of claim 9 wherein said electronics module further comprises a key that engages a slot in said sleeve.

12. The electronics block assembly of claim 9 wherein said sliding member is slidably coupled to opposing sides of said case.

13. The electronics block assembly of claim 9 wherein said sliding member is slidably coupled to a single side of said case.

14. The electronics block assembly of claim 9 further comprising:
a ramp disposed on said sliding member; and
a cam disposed on said locking tap.

15. The electronics block assembly of claim 9 further comprising a slide limiter that limits translation of said sliding member relative to said case.

16. The electronics block assembly of claim 15 wherein said slide limiter is a stop member that engages said sliding member.

17. The electronics block assembly of claim 9 further comprising a friction tab that engages a detent so as to indicate a position of said sliding member.

18. A method comprising
disposing an electronics assembly within a case to form an electronics module comprising a first connector and a second connector that are accessible through opposite sides of the case, wherein said case comprises:
a locking tab disposed on the case, wherein the locking tab is biased to an extended position; and
a sliding member slidably coupled to the case and operable to move the locking tab to a retracted position;
installing the electronics module into a sleeve disposed within a housing, wherein the locking tab engages the sleeve when the locking tab is in the extended position; and
connecting the first connector of the electronics module to a backplane disposed within the housing.

19. The method of claim 18 further comprising installing electrical connectors to the second connector of the electronics module.

20. The method of claim 18 further comprising:
moving the locking tab to the retracted position by translating the sliding member relative to the case, wherein the locking tab is disengaged from the sleeve when the locking tab is in the retracted position; and
removing the electronics module from the sleeve.

* * * * *